US009715913B1

(12) United States Patent
Yin et al.

(10) Patent No.: US 9,715,913 B1
(45) Date of Patent: Jul. 25, 2017

(54) TEMPERATURE CODE CIRCUIT WITH SINGLE RAMP FOR CALIBRATION AND DETERMINATION

(71) Applicant: SanDisk Technologies LLC, Plano, TX (US)

(72) Inventors: Jiang Yin, San Jose, CA (US); Jongmin Park, Cupertino, CA (US); Emilio Yero, Sunnyvale, CA (US); Steve Choi, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/814,277

(22) Filed: Jul. 30, 2015

(51) Int. Cl.
G11C 7/22 (2006.01)
G01K 7/00 (2006.01)
H03K 4/50 (2006.01)
G05F 3/24 (2006.01)

(52) U.S. Cl.
CPC ............ G11C 7/222 (2013.01); G01K 7/00 (2013.01); G05F 3/245 (2013.01); H03K 4/50 (2013.01)

(58) Field of Classification Search
CPC .......... G11C 7/222; G05F 3/245; H03K 4/50; G01K 7/00
See application file for complete search history.

(56) References Cited

U.S. PATENT DOCUMENTS

| 3,961,325 | A | * | 6/1976 | Kendall et al. ..... H03M 1/1009 341/120 |
| 4,257,034 | A | * | 3/1981 | Wilkinson ............ F02P 5/1502 341/118 |
| 5,532,962 | A | | 7/1996 | Auclair et al. |
| 6,560,152 | B1 | | 5/2003 | Cernea |
| 6,735,546 | B2 | | 5/2004 | Scheuerlein |
| 6,801,454 | B2 | | 10/2004 | Wang et al. |
| 6,839,281 | B2 | | 1/2005 | Chen et al. |
| 6,954,394 | B2 | | 10/2005 | Knall et al. |
| 6,956,516 | B2 | | 10/2005 | Furuichi |
| 7,057,958 | B2 | | 6/2006 | So et al. |
| 7,236,023 | B2 | | 6/2007 | Thorp et al. |
| 7,269,092 | B1 | | 9/2007 | Miwa |
| 7,277,343 | B1 | | 10/2007 | So et al. |
| 7,283,414 | B1 | | 10/2007 | So et al. |
| 7,342,831 | B2 | | 3/2008 | Mokhlesi et al. |

(Continued)

OTHER PUBLICATIONS

Guan et al., "A 3 V 110 μW 3.1 ppm/C Curvature-compensated CMOS Bandgap Reference," Analog Integr Circ Sig Process, 2010, vol. 62, pp. 62:113-62:119.

(Continued)

Primary Examiner — J. H. Hur

(57) ABSTRACT

Techniques and circuitry are presented for more rapidly and accurately obtaining a temperature code (TCO) on an integrated circuit. A comparison voltage is ramped up and two counts are determined concurrently, a first count on how many clock cycles for the comparison voltage to ramp up from a low reference voltage to a proportional to absolute temperature (PTAT) and a second count for the number of clock cycles for the comparison voltage to go from the low reference voltage to a high reference voltage. The TCO value is then obtained by using the second count in a post-processing calibration to adjust the first count. An initial calibration can also be included when the circuit is powered up.

21 Claims, 7 Drawing Sheets

(56) References Cited

U.S. PATENT DOCUMENTS

| | | |
|---|---|---|
| 7,391,650 B2 | 6/2008 | Mokhlesi et al. |
| 7,646,659 B2 | 1/2010 | Sako |
| 7,889,575 B2 | 2/2011 | Wang et al. |
| 8,004,917 B2 | 8/2011 | Pan et al. |
| 2003/0152390 A1 | 8/2003 | Stewart et al. |
| 2007/0286004 A1 | 12/2007 | Kim et al. |
| 2008/0031066 A1 | 2/2008 | Nandi |
| 2008/0094908 A1 | 4/2008 | Mokhlesi et al. |
| 2008/0094930 A1 | 4/2008 | Mokhlesi et al. |
| 2008/0158947 A1 | 7/2008 | Li et al. |
| 2008/0158970 A1 | 7/2008 | Sekar et al. |
| 2008/0158975 A1 | 7/2008 | Sekar et al. |
| 2008/0159000 A1 | 7/2008 | Li et al. |
| 2008/0238530 A1 | 10/2008 | Ito et al. |
| 2008/0247253 A1 | 10/2008 | Nguyen et al. |
| 2008/0247254 A1 | 10/2008 | Nguyen et al. |
| 2009/0003109 A1 | 1/2009 | Thorp et al. |
| 2009/0003110 A1 | 1/2009 | Thorp et al. |
| 2009/0091311 A1 | 4/2009 | Kang |
| 2009/0296465 A1 | 12/2009 | Wang et al. |
| 2010/0074033 A1 | 3/2010 | Pan et al. |
| 2016/0061667 A1* | 3/2016 | Hwang et al. .......... G01K 7/00 374/183 |

OTHER PUBLICATIONS

Guanwan et al., "A Curvature-Corrected Low-Voltage Bandgap Reference," IEEE Journal of Solid-State Circuits, vol. 28, No. 6, Jun. 1993, pp. 667-670.

Malcovati et al., "Curvature Compensated BiCMOS Bandgap with 1 V Supply Voltage," Proceedings of the 26th European Solid-State Circuits Conference, IEEE, Sep. 19-21, 2000, 4 pages.

Mok et al., "Design Considerations of Recent Low-voltage Low-Temperature-Coefficient CMOS Bandgap Voltage Reference," Proceedings of the Custom Integrated Circuits Conference, Nov. 22, 2004, IEEE, 8 pages.

Ning et al., "A Low Drift Curvature-compensated Bandgap Reference with Trimming Resistive Circuit," J. Zhejiang Univ-Sci C, Comput & Electron, 2011, 12(8), pp. 698-706.

Tao et al., "Low voltage Bandgap Reference with Closed Curvature Compensation," Journal of Semiconductors, Mar. 2009, pp. 035006-1-035006-4.

* cited by examiner

TEMPERATURE CODE CIRCUIT WITH SINGLE RAMP FOR CALIBRATION AND DETERMINATION

BACKGROUND

This following pertains generally to the field of circuits for the determination of a temperature code and, more particularly, to techniques for improving the efficiency of their operation and calibration.

The various components of an integrated circuit often behave differently at different temperatures. Because of this, operating parameters on the circuit are often adjusted based on the temperature. This requires a determination of the temperature and, for this purpose, the circuit may include a circuit for determining a parameter indicative of the temperature, or temperature code, that is then used to set these operating parameters. The temperature code (TCO) typically provides a multi-bit digital value that is then used to set the relative parameters. For example, in the case of a non-volatile memory circuitry, various sensing parameters used in read and verify operations are often adjusted based on a temperature code. Although these circuits are typically trimmed to be accurate when a device is initial set up, they will usually need to be calibrated before generating the temperature code in order to ensure accuracy. Considering the memory circuit example again, when the circuit receives a read request, the temperature code circuit would first be calibrated, then the code generated, after which the code is provided to state machine to select the appropriate sensing parameters. The need to perform the separate calibration operation can slow down the process.

SUMMARY

A method includes receiving a command for a data access operation at a memory circuit and, in response to receiving the command for the data access operation, determining a temperature code. Determining the temperature code includes generating a comparison voltage having a ramping waveform, and, while ramping the comparison voltage: concurrently starting first and second counters for a number of cycles of a clock signal when the comparison voltage satisfies a first reference voltage threshold; stopping the first counter when the comparison voltage satisfies a temperature dependent voltage threshold to obtain a first count value; and stopping the second counter when the comparison voltage satisfies a second reference voltage threshold to obtain a second count value. The first count value is then adjusted based upon the value of the second count value relative to a reference count to obtain the temperature code. One or more parameters for the data access operation are then set based upon the obtained temperature code; and the data access operation is performed using the one or more parameters as set based upon the obtained temperature code.

An integrated circuit includes a temperature code generating circuit connected to receive a clock signal, a first reference voltage, a second reference voltage, and a temperature dependent voltage and generate from these a digital temperature code value in response to an enable signal. The temperature code generating circuit includes: a ramp generation circuit to generate a comparison voltage having a ramp waveform; comparators connected to receive the comparison voltage, the first reference voltage, the second reference voltage, and the temperature dependent voltage; a timer connected to the comparators and configured to receive the clock signal; and logic circuitry. The timer concurrently start first and second counters when the comparison voltage crosses the first reference voltage, stop the first counter to determine a first count value when the comparison voltage crosses the temperature dependent voltage, and stop the second counter to determine a second count value when the comparison voltage crosses the second reference voltage. The logic circuitry is connected to the counter and is configured to receive the first and second count values and adjust the first count value based upon the value of the second count value relative to a reference count to obtain the temperature code.

A non-volatile memory system includes a controller and a non-volatile memory circuit that has a temperature parameter generating circuit to generate a digital temperature parameter value in response to the non-volatile memory circuit receiving a command for a data access operation from the controller. The temperature parameter generating circuit includes: a ramp generation circuit to generate a comparison voltage; comparators; counters; and logic circuitry. The comparators are connected to receive the comparison voltage, the first reference voltage, the second reference voltage, and the temperature dependent voltage. The counters are connected to the comparators and configured to receive the clock signal, wherein the counters concurrently start first and second counters when the comparison voltage equals the first reference voltage, stop the first counter to determine a first count value when comparison voltage equals the temperature dependent voltage, and stop the second counter to determine a second count value when ramp voltage equals second reference voltage. The logic circuitry is connected to the counter receive the first and second count values and adjust the first count value based upon the value of the second count value relative to a reference count to obtain the temperature parameter. The non-volatile memory circuit sets one or more parameters for the data access operation based upon the obtained temperature parameter and performs the data access operation using the one or more parameters as set based upon the obtained temperature parameter.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

As noted in the Background, integrated circuits often include an on-chip temperature code circuit that receives a temperature dependent voltage, such as proportional to absolute temperature (PTAT) value from a bandgap circuit, and generate from this a parameter indicative of this temperature, or temperature code TCO (or sometimes digital TCO, or DTCO). The TCO value is then used to set various operating parameters on the circuit so that they perform properly at the current operating temperature. The following discussion is given in the context of a non-volatile memory circuit, but the concepts also can be used in other application needing both speed and accuracy when determining a temperature coefficient.

More specifically, a one ramp scheme is used for the temp code determination, allowing for the temperature code to be obtained in a shorter time. This allows the time required for operations using a temp code, such as a read operation, to be reduced. Two counts are determined concurrently, one for ramping up from a first reference voltage to the PTAT value and the other for ramping from the first reference voltage to a second reference voltage. A post-processing scheme is then used to accurately determine the code from the two counts. An initial first ramp determination at power-up can also be included to further improve accuracy. The area penalty in the one ramp, two count scheme is minimal, using an additional latch of 8-bits for an 8-bit count, for example, to store first ramp calibration data.

Figure 1:
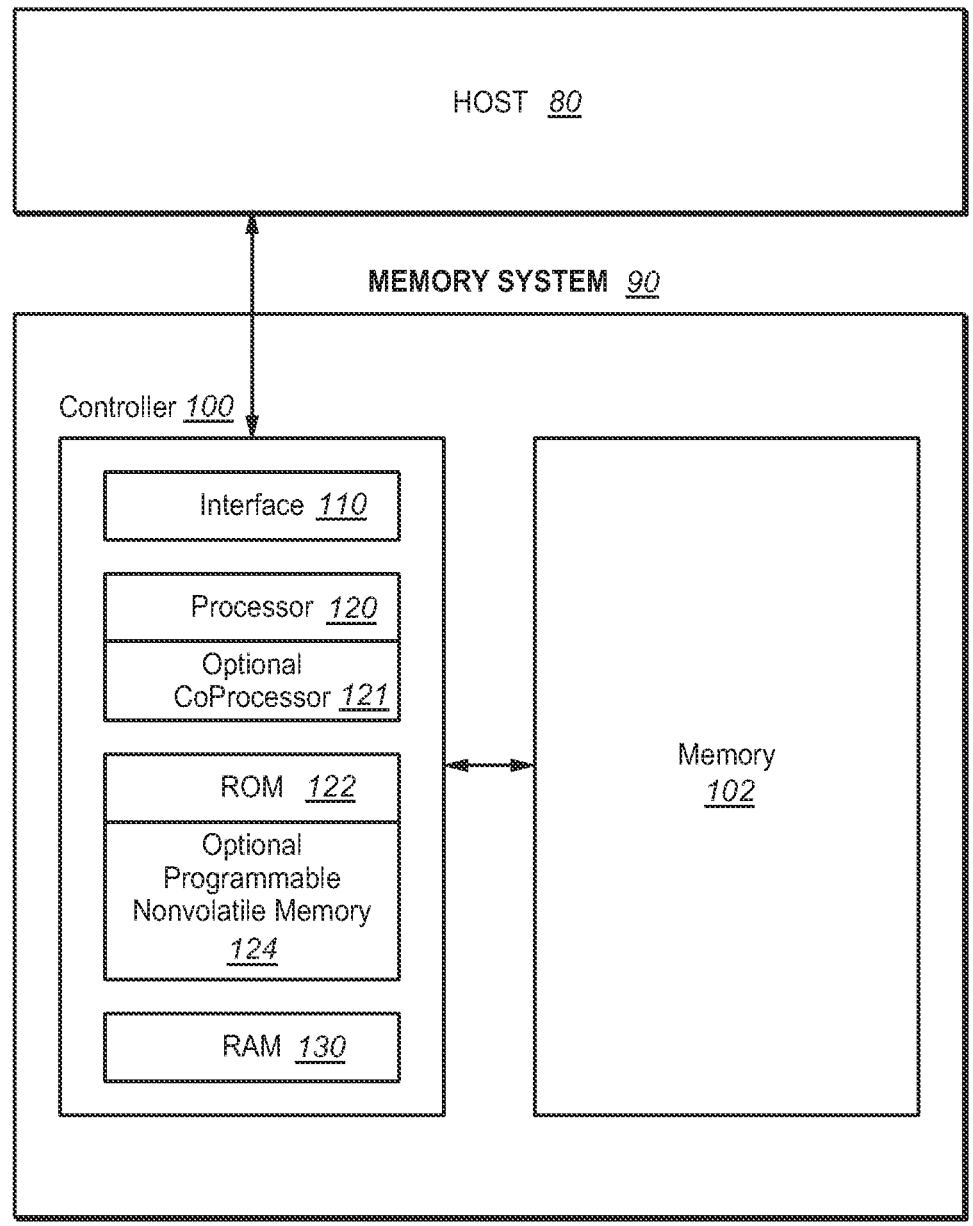
FIG. 1 is a schematic illustration of an example of some of the main hardware components of a memory.

To provide some background for discussing these aspects in the context of a non-volatile memory embodiment, FIG. 1 is a schematic illustration of an example of some of the main hardware components of a memory. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip, which can include temperature code circuitry. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described cover all relevant memory structures within the spirit and scope as described herein. More detail on such memory devices and systems is given in U.S. patent application Ser. No. 14/528,711 filed on Oct. 30, 2014.

Figure 2:
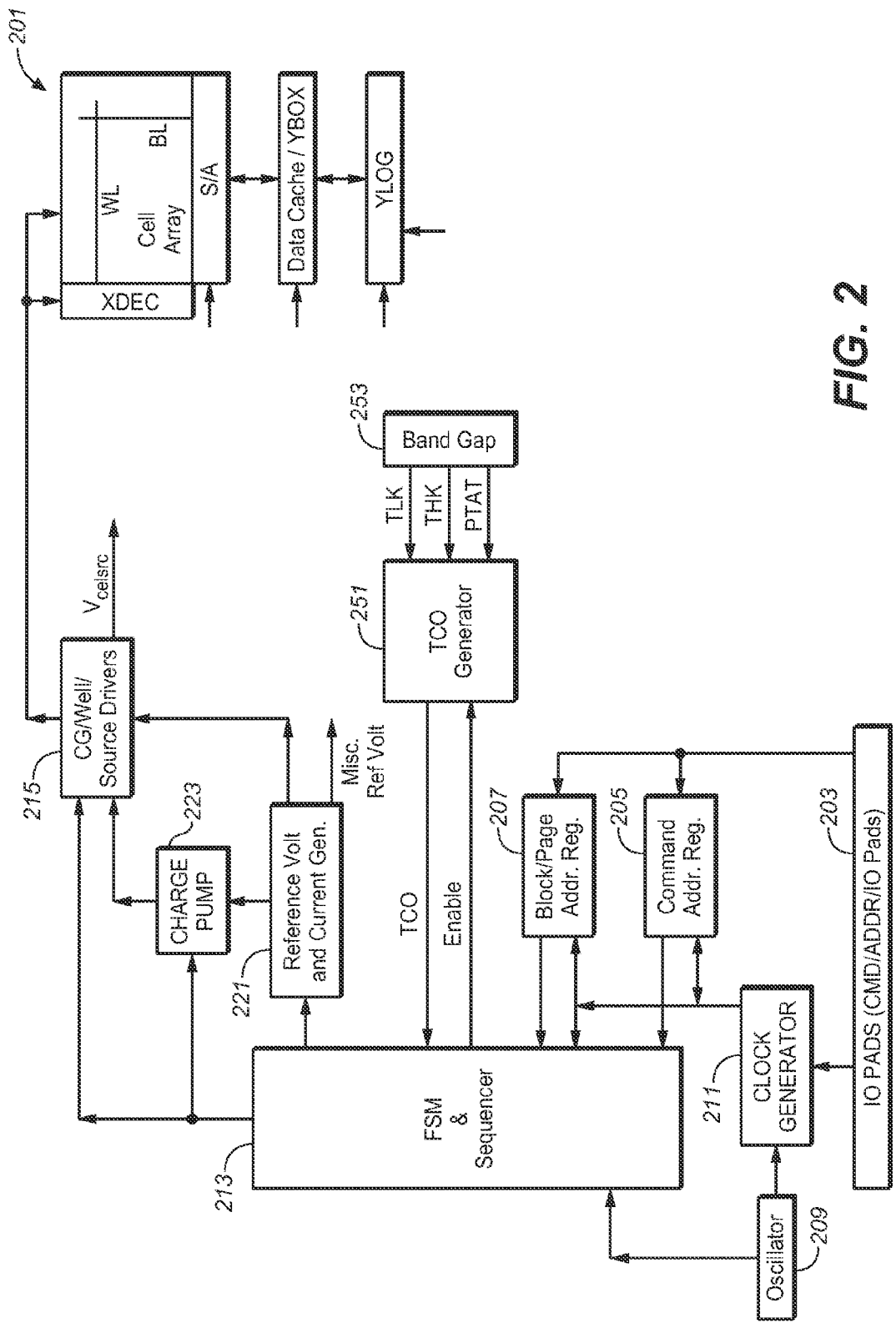
FIG. 2 shows of some of the elements on the memory chip.

FIG. 2 is a schematic representation of some of the elements on the memory chip that are involved in this process. A number of different embodiments are possible, but shows some of the elements. The array 201 and its associated decoding and sensing circuitry can be of the BiCS or other 3D variety, but is here shown in more of a 2D sort of representation for simplicity. The memory circuit has a set of IO pads 203 for commands, addresses and data transfer, which can then be passed on to command and block/page address registers (205, 207). An oscillator 209 can be used with the clock generator 211 to provide needed clock signals. A finite state machine (FSM) and Sequencer block 213 represented to on-chip control logic that controls the various drivers 215 for the array 201. References voltage and current generators 221 supply the various reference levels, including those supplied to the charge pump circuits block 223.

The state machine block 213 receives a temperature code TCO from the TCO generation circuit 251 and then can select the appropriate operating parameters. For example, in a read or verify, operating parameters could be the various bias levels (such as word line voltages) or compare levels. In an erase or program, other examples of the operating parameters could also correspond to pulse levels or durations. As device scales shrink, and more data states are stored within smaller threshold windows, accurately accounting for temperature related variations in device operation becomes increasingly important. The exemplary embodiment uses a low reference voltage TLV and a high reference voltage THV, as well at the PTAT level to determine TCO, and these can be provided by band-gap circuits represented at 253.

Figure 3:
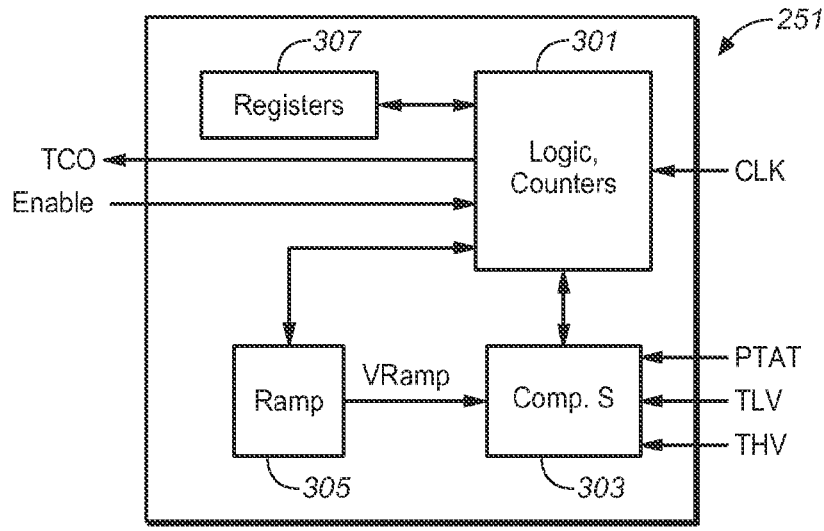
FIG. 3 is a schematic representation of some elements that can be used in the TCO generation circuit.

FIG. 3 is a schematic representation of some elements that can be used in the TCO generation circuit 251. When the circuit is enabled by the state machine 213, a ramp generating circuit 305 produces a voltage, Vramp, that is supplied to comparators 303, which also receives the PTAT voltage, a high reference level THV, and a low reference level TLV. Logic circuit and counters, or timer, 301 control the process and receive (or generate) a clock signal CLK. Based on the clock signal and the comparators, the logic/counter block can count the number of cycles (or half-cycles to determine and store count values in the registers 307. Based on the count values, the TCO generation circuit 251 determines the TCO value and sends the TCO value out of the TCO generation circuit. Although these element are shown as discreet and separate from one another and the state machine block for expository purposes, in an actual circuit they may be combined in various ways and implemented through various combinations of hardware, firmware and software.

Figure 4:
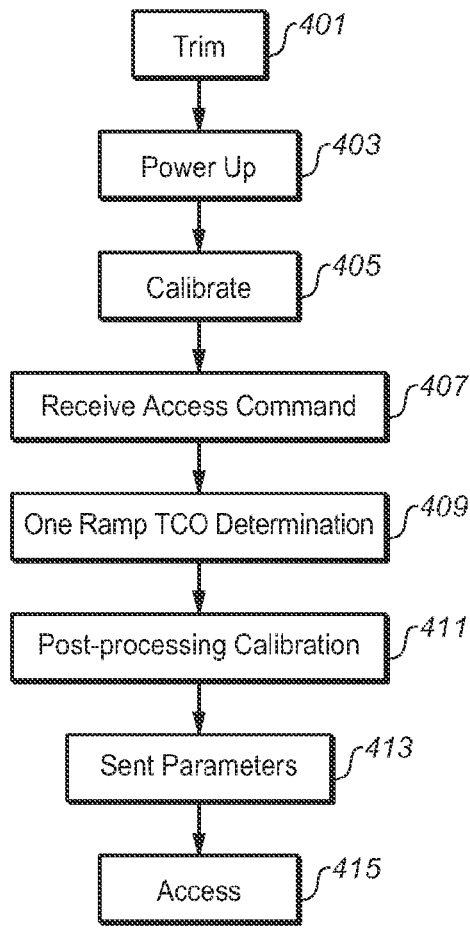
FIG. 4 is a flow chart of some elements of the processes involved in an exemplary embodiment.

FIG. 4 is a flow chart to illustrate some elements of the processes involved in an exemplary embodiment. At die sort, the circuit will usually be trimmed so that a specified temperature range corresponds to a particular number of counts, as included at 401. For example, the device may be calibrated so that a ramping voltage takes 128 count to go from a low reference voltage corresponding to −43 C to a high reference voltage corresponding 85 C.

Once a device is sent out for use, whenever the circuit is powered up at 403, a first ramp process can be used to calibrate the TCO circuit at 405, as it may have drifted since the initial trim. In some embodiments, this initial calibration at power up may be skipped. Some time later the device may need to perform an operation for which it needs a TCO value. For example, in the non-volatile memory circuit example, this could be a read or other access request from the controller, as at 407. At 409, the one ramp TCO determination is performed.

FIG. 4 is a simplified flow in several respects. For example, a number of commands may be performed before receiving, at 407, a command that will make use of a TCO valued, in which case the TCO determination of 409 (and following elements of the flow) would be not be implemented. For commands that do want a TCO value, such as a read operation, the determined TCO can then be used for a sequence of commands: for example, if the command at 407 is for reading of a number of data pages from a memory device, the TCO value at 409 can be used for the full sequence involved, as opposed to re-determining a TCO for each page or set of pages read. Additionally, once completing the command (at 415, below) the device would then return to a ready state, looping back to 407 should another command needing a TCO value come in before being shut down.

The TCO determination of 409 uses a single ramp of a linearly increasing voltage waveform, but with two counters: a first count for the number of clock cycles to go from the low reference voltage and a second count for the number cycles form the low reference voltage to the high reference voltage. (The exemplary embodiment is based on an increasing ramp.) The two counts are then used in the post-processing calibration of 411 to determine the TCO value. Previously, two ramps would be used: one for calibration purposes and one to determine the TCO value. By moving the calibration ramp to power up, or even remove it, and using the post-processing calibration process to correct for any calibration drift, TCO values can be obtained more quickly, which can lead to noticeable improvements in performance. In alternate embodiments, if the first ramp calibration at power on is included and considered to provide a sufficiently accurate calibration, the second count and post-processing calibration could be omitted.

At 411 the post processing calibration based on the two counts is performed, as described further below. Based on the determined TCO value, the corresponding parameters (read levels in a non-volatile memory, for example) are set at 413 and operation using these parameter performed at 415. For example, a set of data pages specified by a read command received at 407 would be read based on the TCO value from 411.

Figure 5:
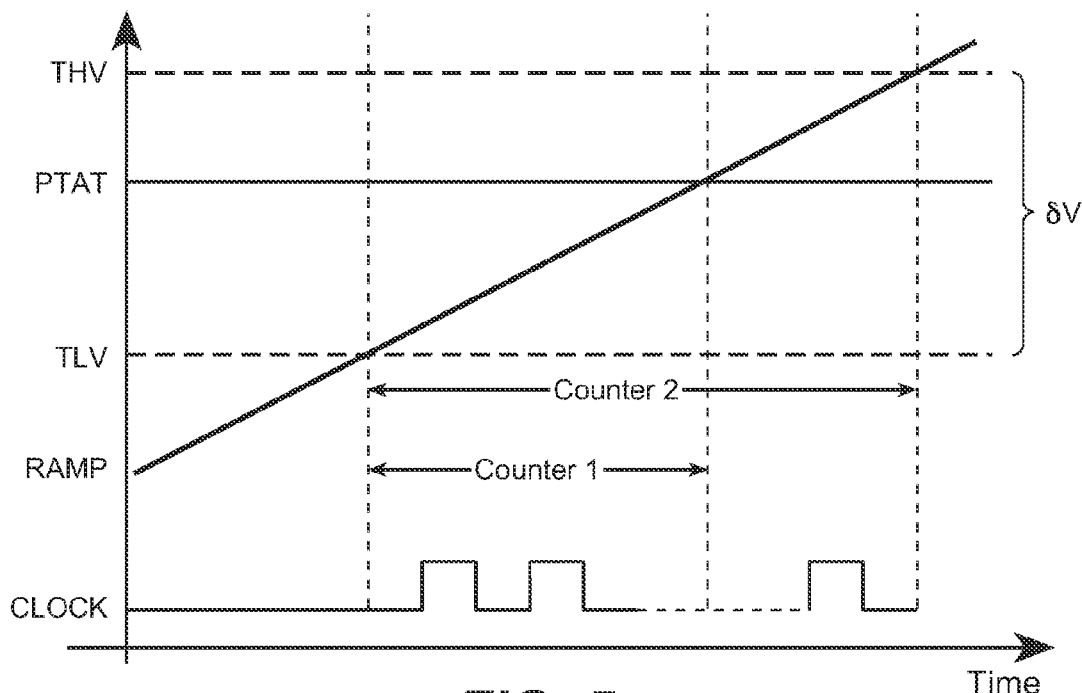
FIG. 5 illustrates some of the details of a one ramp TCO determination scheme.

Some of the details of the one ramp scheme can be illustrated with respect to FIG. 5. A comparison voltage RAMP increases linearly. A voltage level PTAT is shown intermediate to a high reference voltage THV and a low reference voltage TLV. The PTAT is the proportional to absolute temperature level, such as from a band gap circuit. The THV and TLV levels can also be provided by band gap circuits and can be respectively trimmed at die sort to correspond to the PTAT level at, for example, 85 C and −43 C. A clock signal runs across the bottom and the rate of rise for RAMP is trimmed to run over 128 counts, where other trimming temperatures and counts can be used if other temperature ranges and bits of resolution are desired. A value for PTAT in the range δV=THV−LTV then corresponds to one of the 128 counts. Although the range may correspond to 128 counts at die sort, the problem is for this to subsequently be true to ensure accuracy once the device is in use.

The two counts are show on FIG. 5. Both begin when PTAT=TLV. Counter 2 counts from TLV to THV and contains 128 C temp code information. If accurately calibrated, the 128 counts are such that the resolution is 1C/count. Counter 1 counts from TLV to PTAT, where, as PTAT is a voltage which is proportional to temperature (PTAT=K*T), this is converted into the current temp code information with the number of counts being the current temp code.

Figure 6A:
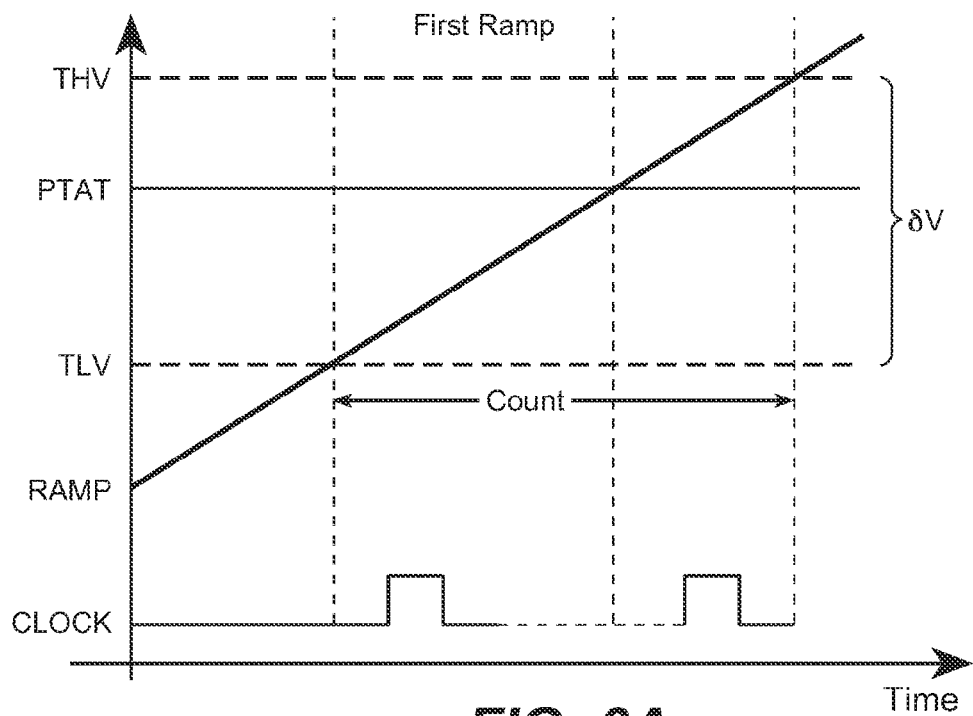
FIGS. 6A and 6B look at the first ramp calibration process that can be included at power on to provide calibration data for the one ramp process.
Figure 6B:
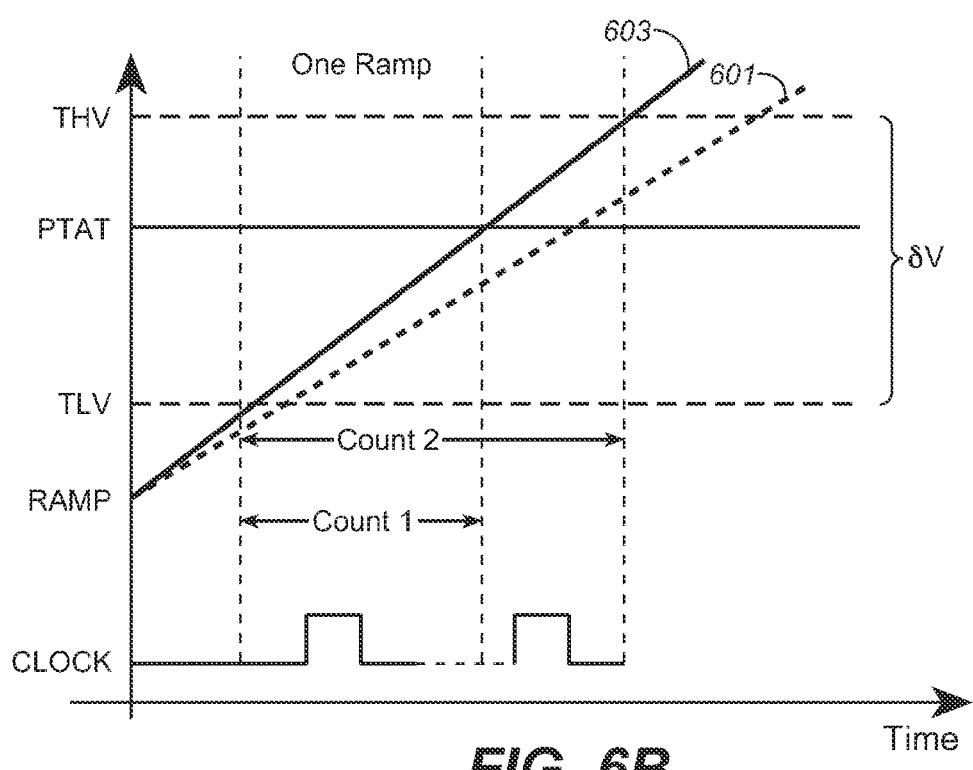

FIGS. 6A and 6B look at the first ramp calibration process that can be included at power on to provide calibration data. During the first ramp at power on (POR), a fixed slope is used for the first ramp as shown in FIG. 6A, and the count of the first ramp is stored as calibration data. FIG. 6B looks again at the one ramp, with two counts to determine TCO. The broken line 601 shows the uncalibrated ramp rate as in FIG. 6A from the first ramp. The solid line 603 is the slope correction such that the number of Counter 2 is calibrated to 128 by the logic algorithm. As the optional first ramp calibration is performed during power up, the reference voltage may vary from first ramp to the normal one ramp operation to determine TCO, so that the post-processing calibration is included in the exemplary flow.

Figure 7:
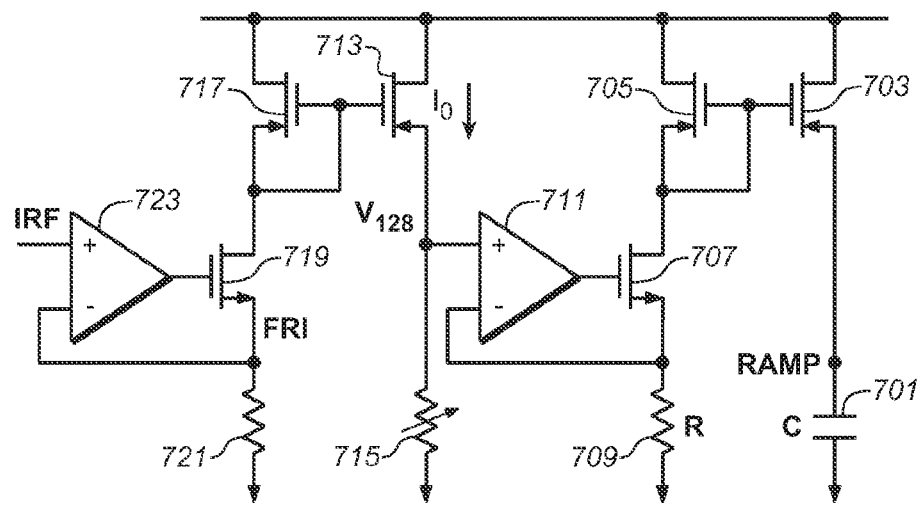
FIG. 7 shows an exemplary embodiment of a circuit to generate the RAMP comparison voltage.
Figure 8A:
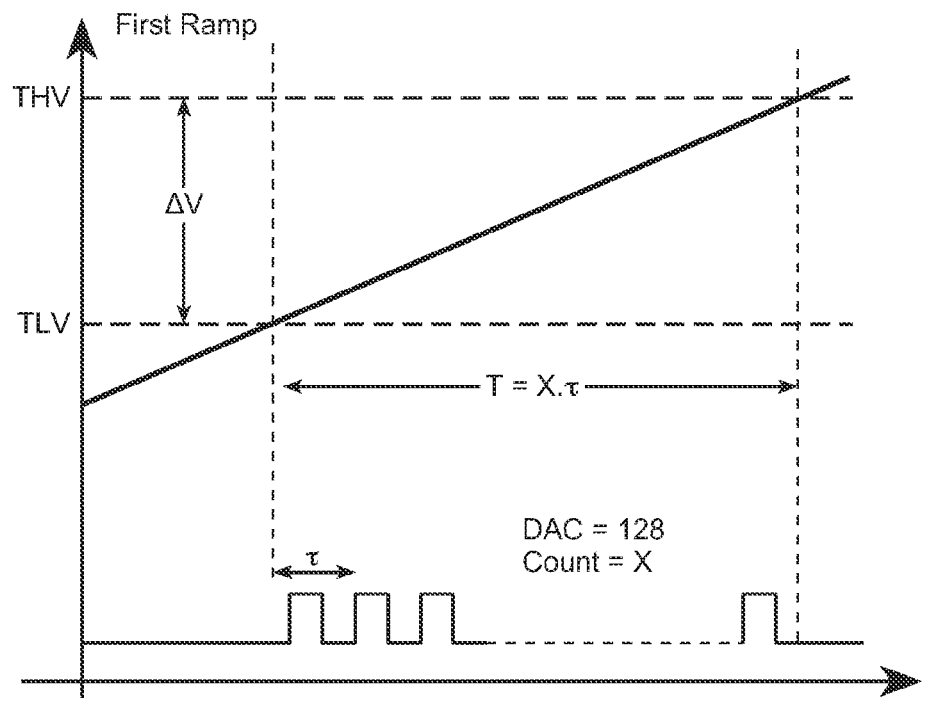
FIGS. 8A and 8B illustrate the application of the first ramp logic algorithm.
Figure 8B:
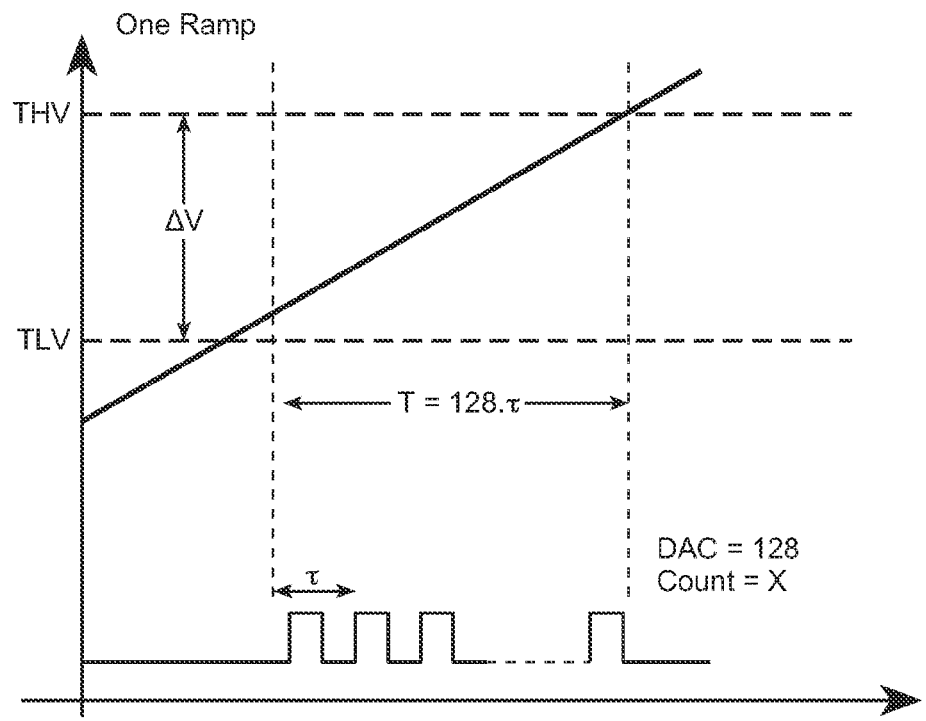

FIG. 7 shows an exemplary embodiment of a circuit to generate the RAMP comparison voltage; and FIGS. 8A and 8B illustrates the application of the first ramp logic algorithm. RAMP is the level at the upper plate of capacitor C 701. As this is supplied by the transistor 703 at a constant current, the RAMP level should rise linearly over time. The transistor 703 is connected in a current mirroring arrangement with transistor 705. The current through is determined by the transistor 707 and resistor R 709. The gate of transistor 707 is controlled op-amp 711 whose first input is connected the node $V_{128}$ and whose second input is feedback from a node between transistor 707 and R 709. A current $I_0$ flows through transistor 713 to the node $V_{128}$ and then through a trimable resistance 715, whose value determines $V_{128}$ based upon $I_0$. The resistance 715 has a value of (DAC*r), where DAC is digital value from a digital to analog converter to set the resistance in terms of the resistance unit r. The current $I_0$ is through the transistor 713 that is connected in a current mirroring arrangement with transistor 717, that is connected in series with the transistor 719 and a resistance 721 connected in series between the supply level and ground. The gate voltage on 719 is set by the op-amp 723 that has a first input connected to a reference level IRF, such as from bandgap circuitry, and a second input connected the feedback node FRI between transistor 719 and resistance 721.

The rate at which RAMP increases will depend on the value of DAC, as this will determine $V_{128}$. If the circuit were accurately trimmed and fully calibrated, setting DAC=128 would correspond to 128 counts to ramp from TLV to THV. To provide a calibration base on a first ramp process at power up, DAC is set to 128 and the counter value X needed to ramp from TLV to THM is determined as illustrated at FIG. 8A. The relationship, as illustrated with respect to FIG. 8A, is $$\frac{128 r I_0}{R} = \frac{C(\delta V)}{X \tau},$$

where r is the unit resistance for the variable resistance 715, $I_0$ is the current through transistor 713, R is the resistance or 709, C is the capacitance of 701, δV=THV−TLV, and τ is the clock period. If the first ramp calibration process at power up in included, then for the one ramp process, DAC can be set to X, so that the number of Counter2 is then calibrated to be 128 according to the relationship:

$$\frac{X r I_0}{R} = \frac{C(\delta V)}{128 \tau},$$

as illustrated in FIG. 8B.

Figure 9:
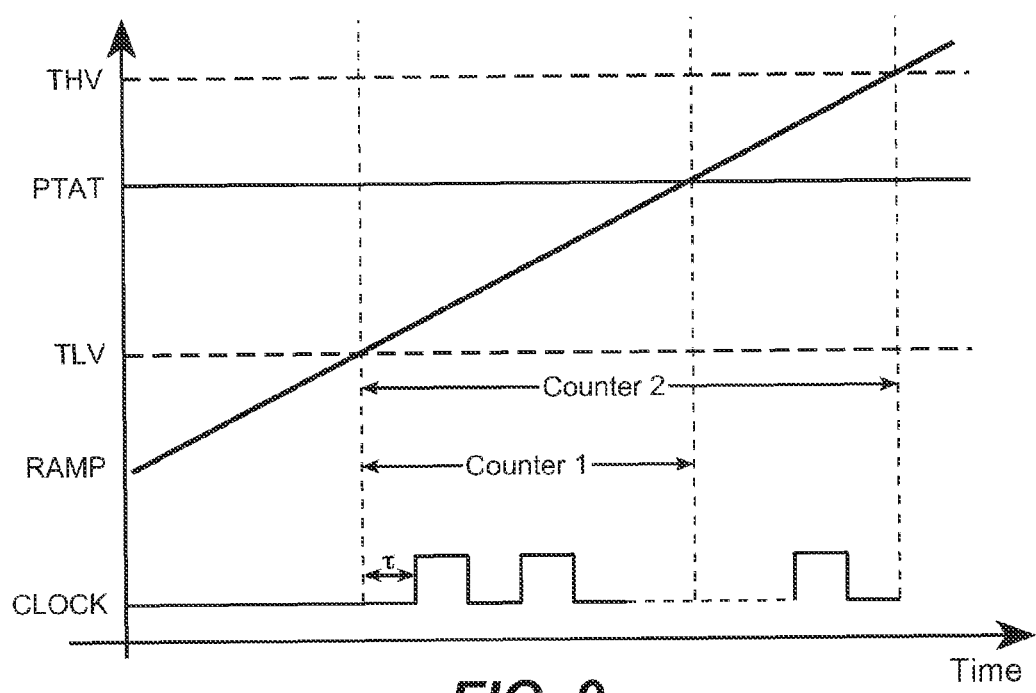
FIG. 9 looks at the one ramp, two count process and post-processing calibration process.

FIG. 9 looks at the one ramp, two count process and post-processing calibration process. With or without the first ramp calibration included, the post-processing calibration can improve the accuracy of the TCO value as the calibration data (Count 2) is obtained at the same time as the TCO data (Count 1). When the circuit is enabled and the comparison voltage RAMP starts to ramp up, both of Counter 1 and Counter 2 start counting the number of half-cycles of CLOCK, which have a value of r, when the comparison RAMP level crosses the low reference level: RAMP=TLV. In the embodiment of FIG. 9, the counters count both the rising and falling edges of the clock, but whole cycles or other multiples of the positive/negative edges could be used. Counter 1 stops when the comparison RAMP level crosses the PTAT level, RAMP=PTAT, and Counter 2 stops when the comparison RAMP level crosses the high reference level at RAMP=THV. Let Y be the value of Counter 1 and X the value of Counter 2 when they stop. Even if the first ramp calibration is performed during power on, the system will typically have reference voltages/clock periods variations in normal operation, so that X≠128. If X were 128, then the device would be calibrated and Y would be the digital TCO value. Calling Y' the TCO value corrected the X value, this has the relationship of:

$$\frac{X*\tau}{Y*\tau} = \frac{128*\tau}{Y'*\tau},$$

or $$Y' = \frac{128*Y}{X},$$

Y' is then the final temperature code supplied to the state machine or other circuit element where it is to be used, and corresponding to when calibrated so that X=128. (As can be seen from the last equation above, Y'=Y when X=128.) This assumes that the counter values have a linear relationship and that RAMP increases linearly, but these conditions should be largely meet since in the exemplary embodiment RAMP is generated by charging a capacitor from a set current. More generally, a less linear, but monotonically increasing waveform can also be used; and alternate embodiments could also use a linearly (or, more generally, monotonically) decreasing comparison waveform.

The foregoing detailed description has been presented for purposes of illustration and description. It is not intended to be exhaustive or to limit the above to the precise form disclosed. Many modifications and variations are possible in light of the above teaching. The described examples were chosen in order to explain the principals involved and its practical application, to thereby enable others to best utilize the various embodiments and with various modifications as are suited to the particular use contemplated. It is intended that the scope be defined by the claims appended hereto.

It is claimed:

1. A method, comprising:
    receiving a command for a data access operation at a memory circuit;
    in response to receiving the command for the data access operation, determining a temperature code, including:
        generating a comparison voltage having a ramping waveform; and
        while ramping the comparison voltage:
            when the comparison voltage satisfies a first reference voltage threshold, concurrently starting first and second counters for a number of cycles of a clock signal;
            stopping the first counter when the comparison voltage satisfies a temperature dependent voltage threshold to obtain a first count value; and
            stopping the second counter when the comparison voltage satisfies a second reference voltage threshold to obtain a second count value; and
        subsequently adjusting the first count value based upon the value of the second count value relative to a reference count to obtain the temperature code;
    setting one or more parameters for the data access operation based upon the obtained temperature code; and
    performing the data access operation using the one or more parameters as set based upon the obtained temperature code.

2. The method of claim 1, wherein generating the comparison voltage includes charging a capacitor on the memory circuit.

3. The method of claim 1, further comprising:
    prior to receiving the command for the data access operation, calibrating a rate at which the comparison voltage ramps.

4. The method of claim 3, wherein the rate is calibrated when the memory circuit is powered up.

5. The method of claim 3, wherein calibrating the rate at which the comparison voltage ramps includes:
    determining a first number of cycles of the clock signal for the comparison voltage to ramp from the first reference voltage threshold to the second reference voltage threshold; and
    adjusting the rate based a comparison of the first number of cycles to the reference count.

6. The method of claim 1, wherein the one or more parameters for the data access operation include a sensing voltage.

7. The method of claim 1, wherein the temperature dependent voltage threshold is a proportional to absolute temperature (PTAT) voltage.

8. The method of claim 1, wherein the memory circuit is a monolithic three-dimensional semiconductor memory device in which memory cells are arranged in multiple physical levels above a silicon substrate and word lines, including a first word line, run in a horizontal direction relative to the substrate.

9. An integrated circuit comprising:
    a temperature code generating circuit connected to receive a clock signal, a first reference voltage, a second reference voltage, and a temperature dependent voltage and generate therefrom a digital temperature code value in response to an enable signal, the temperature code generating circuit including:
        a ramp generation circuit to generate a comparison voltage having a ramp waveform;
        comparators connected to receive the comparison voltage, the first reference voltage, the second reference voltage, and the temperature dependent voltage;
        a timer connected to the comparators and configured to receive the clock signal, wherein the timer concurrently starts first and second counters when the comparison voltage crosses the first reference voltage, stops the first counter to determine a first count value when the comparison voltage crosses the temperature dependent voltage, and stops the second counter to determine a second count value when the comparison voltage crosses the second reference voltage; and
        logic circuitry connected to the first and second counters and configured to receive the first and second count values and adjust the first count value based upon the value of the second count value relative to a reference count to obtain the temperature code.

10. The integrated circuit of claim 9, wherein the ramp generation circuit includes a capacitor and generates the comparison voltage by charging up the capacitor.

11. The integrated circuit of claim 9, wherein the temperature code generating circuit calibrates a rate at which the comparison voltage ramps prior to receiving the enable signal.

12. The integrated circuit of claim 11, wherein the temperature code generating circuit calibrates the rate at which the comparison voltage ramps when the integrated circuit is powered up.

13. The integrated circuit of claim 11, wherein calibrating the rate at which the comparison voltage ramps includes:
    determining a first number of cycles of the clock signal for the comparison voltage to ramp from the first reference voltage to the second reference voltage; and
    adjusting the rate based on a comparison of the first number of cycles to the reference count.

14. The integrated circuit of claim 9, wherein the temperature dependent voltage is a proportional to absolute temperature (PTAT) voltage.

15. The integrated circuit of claim 9, further comprising:
    a bandgap circuit that generates the temperature dependent voltage.

16. The integrated circuit of claim 9, further comprising:
    bandgap circuitry that generates the first and second reference voltages.

17. The integrated circuit of claim 9, wherein the integrated circuit is a non-volatile memory circuit that generates the enable signal in response to receiving a command for a data access operation and the memory circuit sets one or more parameters for the data access operation based upon the obtained temperature code and performs the data access operation using the one or more parameters as set based upon the obtained temperature code.

18. The integrated circuit of claim 17, wherein the integrated circuit is a monolithic three-dimensional semiconductor memory device in which memory cells are arranged in multiple physical levels above a silicon substrate and word lines, including a first word line, run in a horizontal direction relative to the substrate.

19. A non-volatile memory system, comprising:
    a controller; and
    a non-volatile memory circuit having a temperature parameter generating circuit connected to receive a clock signal, a first reference voltage, a second reference voltage, and a temperature dependent voltage and generate a digital temperature parameter value in response to the non-volatile memory circuit receiving a command for a data access operation from the controller, the temperature parameter generating circuit including:
        a ramp generation circuit to generate a comparison voltage;
        comparators connected to receive the comparison voltage, a first reference voltage, a second reference voltage, and a temperature dependent voltage;
        counters connected to the comparators and configured to receive a clock signal, wherein the counters concurrently start first and second counts when the comparison voltage equals the first reference voltage, stop the first count to determine a first count value when the comparison voltage equals the temperature dependent voltage, and stop the second count to determine a second count value when a ramp voltage equals the second reference voltage; and
        logic circuitry connected to the counters to and configured to receive the first and second count values and to adjust the first count value based upon the value of the second count value relative to a reference count to obtain the temperature parameter,
    wherein the non-volatile memory circuit sets one or more parameters for the data access operation based upon the obtained temperature parameter and performs the data access operation using the one or more parameters as set based upon the obtained temperature parameter.

20. The non-volatile memory system of claim 19, wherein the data access operation is a read operation and the one or more parameters for the data access operation include a sensing voltage.

21. The non-volatile memory system of claim 19, wherein the non-volatile memory circuit is a monolithic three-dimensional semiconductor memory device in which memory cells are arranged in multiple physical levels above a silicon substrate and word lines, including a first word line, run in a horizontal direction relative to the substrate.

* * * * *